US007861030B2

(12) United States Patent
Davis

(10) Patent No.: US 7,861,030 B2
(45) Date of Patent: Dec. 28, 2010

(54) METHOD AND APPARATUS FOR UPDATING DATA IN ROM USING A CAM

(75) Inventor: Paul G. Davis, San Jose, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 492 days.

(21) Appl. No.: 12/042,384

(22) Filed: Mar. 5, 2008

(65) Prior Publication Data
US 2009/0043957 A1 Feb. 12, 2009

Related U.S. Application Data

(60) Provisional application No. 60/964,197, filed on Aug. 8, 2007.

(51) Int. Cl.
*G06F 12/00* (2006.01)
(52) U.S. Cl. .................. 711/108; 711/5; 711/102; 711/163; 711/165
(58) Field of Classification Search ........................ None
See application file for complete search history.

(56) References Cited

U.S. PATENT DOCUMENTS

| 4,376,300 | A | | 3/1983 | Tsang |
| 4,982,360 | A | * | 1/1991 | Johnson et al. ............. 711/108 |
| 4,987,813 | A | * | 1/1991 | Viazanko ................... 83/471.3 |
| 5,175,828 | A | | 12/1992 | Hall et al. |
| 5,949,703 | A | | 9/1999 | Shibata et al. |
| 6,031,867 | A | | 2/2000 | Johnson et al. |
| 6,304,950 | B1 | | 10/2001 | Inoue et al. |
| 6,530,005 | B2 | | 3/2003 | Koschella et al. |
| 7,073,094 | B1 | * | 7/2006 | Jackson et al. ................ 714/30 |
| 7,243,206 | B2 | | 7/2007 | Kimelman et al. |
| 2004/0170057 | A1 | * | 9/2004 | Khouri et al. .......... 365/185.09 |
| 2008/0228993 | A1 | * | 9/2008 | Lin et al. ..................... 711/100 |
| 2008/0301362 | A1 | * | 12/2008 | Cavanna et al. ............. 711/108 |
| 2009/0031090 | A1 | * | 1/2009 | Henry et al. ................ 711/154 |

* cited by examiner

*Primary Examiner*—Jack A Lane
(74) *Attorney, Agent, or Firm*—King & Spalding L.L.P.

(57) ABSTRACT

A method for providing field updates through the use of a memory emulation circuit with a content addressable memory (CAM) as the intelligent portion of the emulation circuit's arbiter. CAM circuit 200 is comprised of configurable memory and is initially unprogrammed. Address requests are passed straight through multiplexer 201 to Read Only Memory (ROM) 202. As a result the data in the data location in ROM 202 that corresponds to the requested address will be output to data bus 205. If data locations in ROM 202 become defective or contain data that needs to be upgraded the circuit implements a remapping of the data location. CAM circuit 200 is programmed with direct addresses to be replaced in ROM 202. The direct addresses are paired to emulation addresses of data locations in configurable memory 203. Upgraded or substitute data is programmed into the configurable memory 203 at the paired emulation address. When address requests are received thereafter, CAM circuit 200 compares the address request to its stored direct addresses. If a match is found the paired emulation address is passed through multiplexer 201 instead of the direct address. As a result, the substitute or upgraded data in configurable memory 203 is output to data bus 205 in place of the old data.

18 Claims, 3 Drawing Sheets

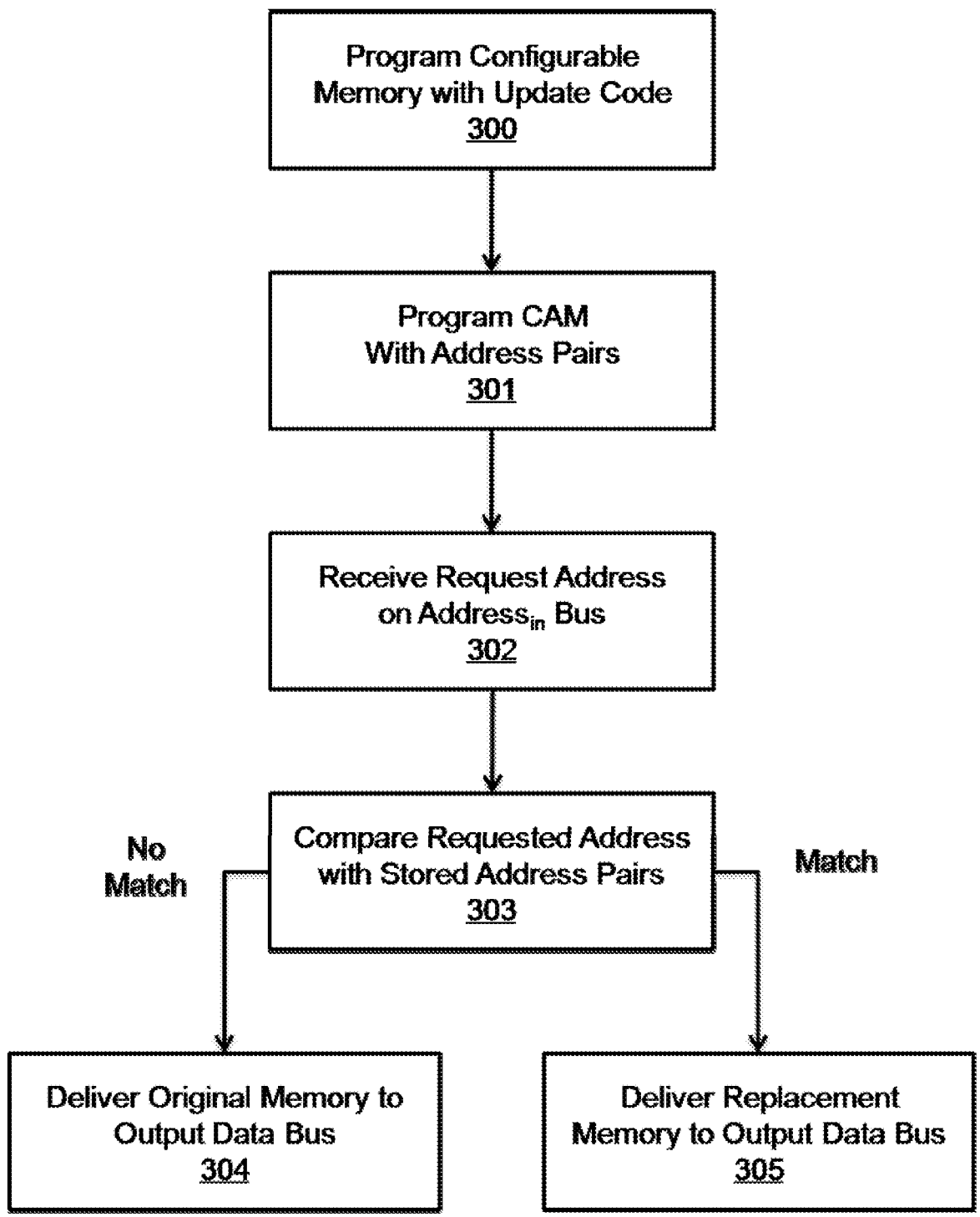

US 7,861,030 B2

METHOD AND APPARATUS FOR UPDATING DATA IN ROM USING A CAM

RELATED APPLICATION

This application claims priority to U.S. Provisional Patent Application Ser. No. 60/964,197 filed on Aug. 8, 2007 entitled "Method and Apparatus for Updating Data in ROM Using a CAM," which is hereby incorporated by reference as if set forth in full in this application for all purposes.

FIELD OF THE INVENTION

The invention relates generally to electronic computational systems, and more specifically to field upgrades of electronic computational systems.

BACKGROUND OF THE INVENTION

After manufacture and deployment, electronic systems may suffer from obsolescence or errors in the system's manufacture and design. It is therefore appealing to create a configurable electronic system so that any errors discovered when the device is already in the field can be modified. Such modifications are called field updates and are highly desirable in modern electronics owing to the increasingly rapid rate of technological improvement. Set against this desirable aspect is the fact that making a circuit configurable comes with an associated cost in complexity, area, and power. At one end of the configurability tradeoff is mask Read Only Memory (ROM). Mask ROM is formed as part of the device during manufacture and cannot be altered which makes it the cheapest but least configurable type of electronic memory. In contrast to ROM, Programmable Read Only Memory (PROM) does not hold data until the memory is programmed at some point after manufacture. Often times, PROM can additionally be erased and reprogrammed after it is given its initial programmed state. An equivalent amount of ROM will consume considerably less area than PROM. In addition, the inherently stable nature of non-configurable memory leads to ROM being an extremely reliable storage medium. It is therefore highly beneficial from a cost and reliability perspective to house core data in ROM, while it is beneficial for device functionality and adaptability to store such data in configurable memory.

The use of configurable memory for storing operation code is known in the prior art. For example, in U.S. Pat. No. 6,031,867 to Johnson the firmware of a modem can be upgraded because it is all stored in electrically erasable programmable read only memory (EEPROM). Therefore, the operating code can be erased and reprogrammed to update the devices functionality or to fix system errors. There is a wealth of material in the prior art that utilizes similar approaches. Much of the prior art is focused on swapping the old code with the updated code and assuring that the swap has been done correctly. Such a solution provides for full configurability of the electronic system but at considerably high cost in terms of area consumed by the configurable memory arrays.

Another technique for providing configurability to an electronic system is to include an ancillary block of programmable memory that can be called to substitute for the replaced ROM code. Such a combination can emulate the functionality of the original code storage device while providing an updated version of the code to the system. When the computational system requests information from the original code storage device a routing or modification system will intercept or alter the request and provide the corresponding updated code in its place. A general example of this method is described in U.S. Pat. No. 5,949,703 to Shibata. In this patent two ancillary blocks of PROM are utilized wherein one block is used to store the remapping information and the other block is used to store data that will replace defective or incorrect data in the ROM. The apparatus that implements this method is broadly referred to as a virtual memory. The portion of the system that translates the virtual address into the actual read address is often called the arbiter. The benefit of such an approach is that the original code can still be stored on a cheap ROM memory while a small portion of more expensive configurable memory is available in case of design errors or required upgrades.

In U.S. Pat. No. 4,376,300 to Tsang a content-addressable memory (CAM) is used to replace defective entries in a write/read memory array with a redundant write/read array of memory. In the Tsang circuit, a block of memory with an equivalent number of word lines as the main blocks of memory can emulate individual word lines. The purpose of the emulation in this patent is to repair defective memories and it is applied to similar memory blocks. The CAM addresses are stored in Non-volatile Memory (NVM) because the defective memories are permanently replaced. The CAM is utilized to conduct the emulated addressing scheme. A CAM is a hardware implementation of a lookup algorithm that is usually comprised of write/read memory such as static random access memory (SRAM) and is able to complete a search operation in a single clock cycle. This produces a significant speed improvement over software-based lookup methods. The speed advantage of a CAM is accomplished by adding comparison circuitry to every cell of its hardware memory. The CAM will receive a digital code and will check to see if the CAM contains a matching code. If the received code matches one of the stored codes, the CAM will output a different code that corresponds to the code that was matched.

Virtual memories can be used to provide for system upgrades using the same technique as applied in the Tsang circuit. U.S. Pat. No. 6,530,005 to Koschella describes a system level implementation wherein a circuit monitors requests to the original memory and retrieves replacement data when a request for upgraded data is detected. In the Koschella circuit the arbiter and replacement data registers are connected directly to the address and data lines of the circuit and are programmed to replace the original data on receipt of specific addresses on the address lines. A similar technique is described in U.S. Pat. No. 7,243,205 to Kimelman.

SUMMARY OF INVENTION

In one embodiment of the present invention, a circuit is disclosed for providing field upgrade capability to an electronic system. The circuit comprises several parts. The circuit contains a content addressable memory (CAM) arbiter circuit having an input terminal coupled to a request address line that is used to route a direct address, an output terminal outputting an access address, a set of configurable direct addresses, and a set of emulation addresses. The circuit also contains a memory address line coupled to the output terminal of the CAM arbiter that has a first access connection to a first block of memory and a second access connection to a second block of configurable memory. The circuit acts to emulate replaced memory locations in response to direct address requests by having the CAM arbiter circuit output the direct address from the request address line to be used as the access address when the direct address is not in the set of configurable direct addresses, and a particular emulation address of the set of emulation addresses to be used as the access address when the direct address is in the set of configurable direct addresses. The emulation takes effect in the circuit by having the memory address line select replacement data from the second block of configurable memory or original data from the main memory block at the delivered access address to be passed to an output data line.

In another embodiment of the present invention a method is disclosed for providing field upgrades to an electronic system after manufacture. An upgrade is implemented by programming a block of configurable memory with replacement data to act as an upgrade of data in a first memory block and encoding a CAM with direct addresses and emulation addresses. After such an upgrade is conducted the circuit implements an emulation by receiving a direct address request on a request address line, comparing the direct address request to the direct addresses encoded in the CAM, and delivering a corresponding emulation address of one of the particular direct address to an address line as an access address if the direct address request is equivalent to the emulated addresses' corresponding direct address. As a result of the upgrade and emulation a replacement memory segment of the second block of configurable memory is retrieved for the electronic system when an upgraded address is accessed and an original memory segment of said first memory block is otherwise retrieved for the electronic system.

BRIEF DESCRIPTION OF THE DRAWINGS

FIG. 3 is a flowchart that illustrates exemplary steps for a method that is consistent with the present invention.

DETAILED DESCRIPTION OF THE PREFERRED EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

The present invention utilizes a CAM as the intelligent portion of an arbiter to replace data stored in ROM with configurable data stored in configurable memory. The effect of such a system is that the data or operating code stored in non-configurable ROM can be updated or modified after manufacture and distribution with minimal impact on overall cost and performance. The present invention allows for the ROM data to be emulated by the configurable memory by the CAM arbiter. The present invention emulates the ROM with minimal impact on the system in terms of speed, size, and complexity. Since ROM data is replaced by fine accessing of the configurable memory by the CAM, no memory is wasted and the size of the back-up configurable memory can be kept to a minimum. Since the present invention can provide for an emulated read in about the same time that is required for a regular read, the operating speed of a system is maintained when this invention is applied.

Figure 1:
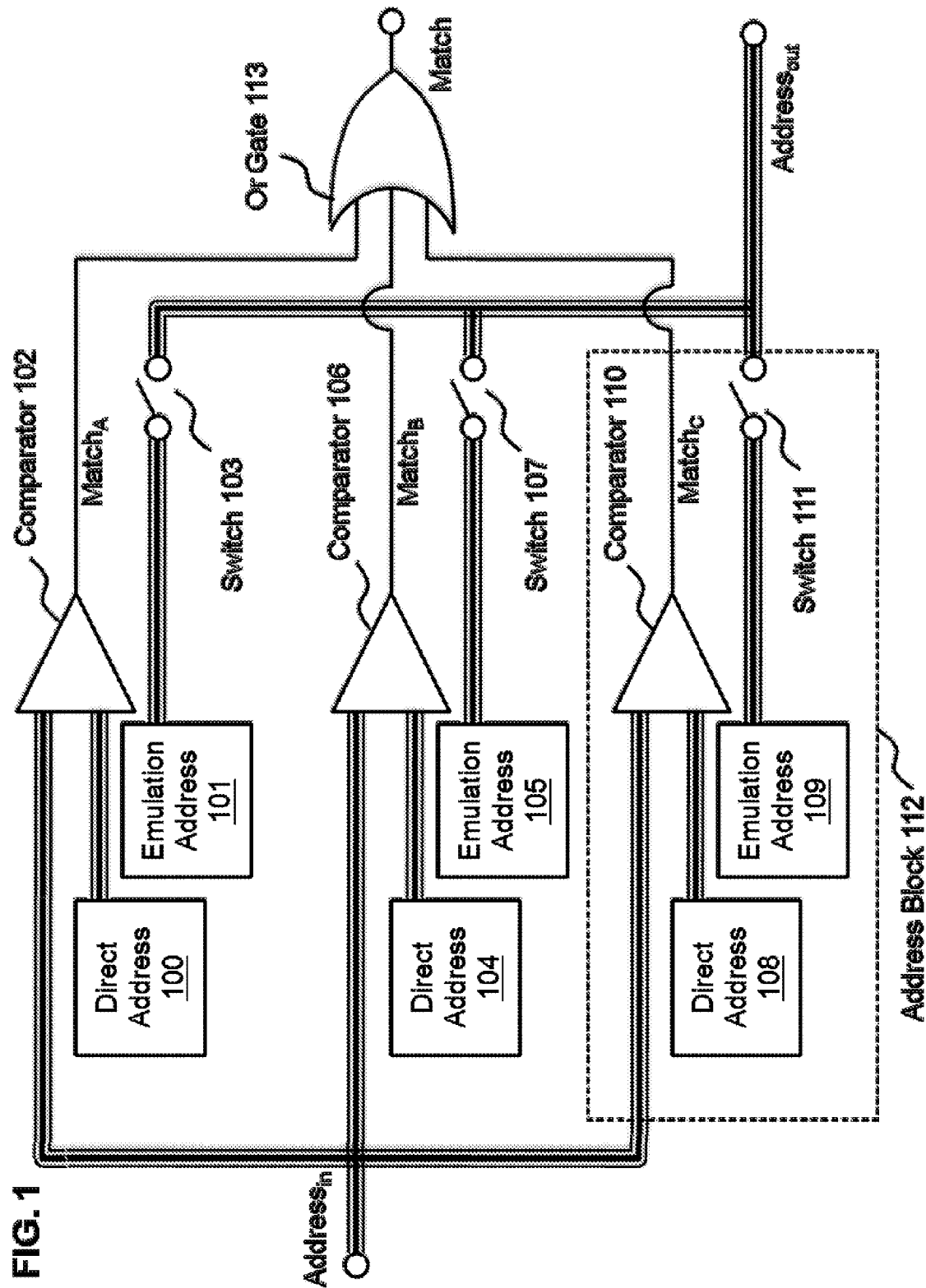
FIG. 1 illustrates a block diagram of a CAM as applied in an embodiment of the present invention.

An operational diagram of a CAM circuit is displayed in FIG. 1. A memory access signal is received on bus $Address_{in}$ that corresponds to a memory address. Comparators 102, 106, and 110 compare the input address signal on bus $Address_{in}$ to the addresses stored in direct address blocks 100, 104, and 108. The addresses in the direct address blocks are configurable. When the input address does not match any of the stored addresses the comparator output signals $Match_A$, $Match_B$ and $Match_C$ are low. In this state, switches 103, 107, and 111 are open and the signal on output node Match is low to indicate that no match is found. Match is low because all the inputs to or gate 113 are low. When $Address_{in}$ does match one of the stored addresses the corresponding comparator will output a high signal on $Match_A$, $Match_B$ or $Match_C$. The signal on output node Match will therefore also be high to indicate that the input address has been matched. In addition, the corresponding switch 103, 107, or 111 will close and the corresponding emulation address block will output its emulation address to bus $Address_{out}$. In one embodiment of the invention, the emulation addresses stored in emulation address blocks 101, 105, and 109 are configurable. The delay time of the comparator and switch are negligible in comparison to the time for a typical register read operation. It is also important to note than the CAM can be comprised of any number of address blocks 112 so long as the addresses stored in the direct address blocks are mutually exclusive.

Figure 2:
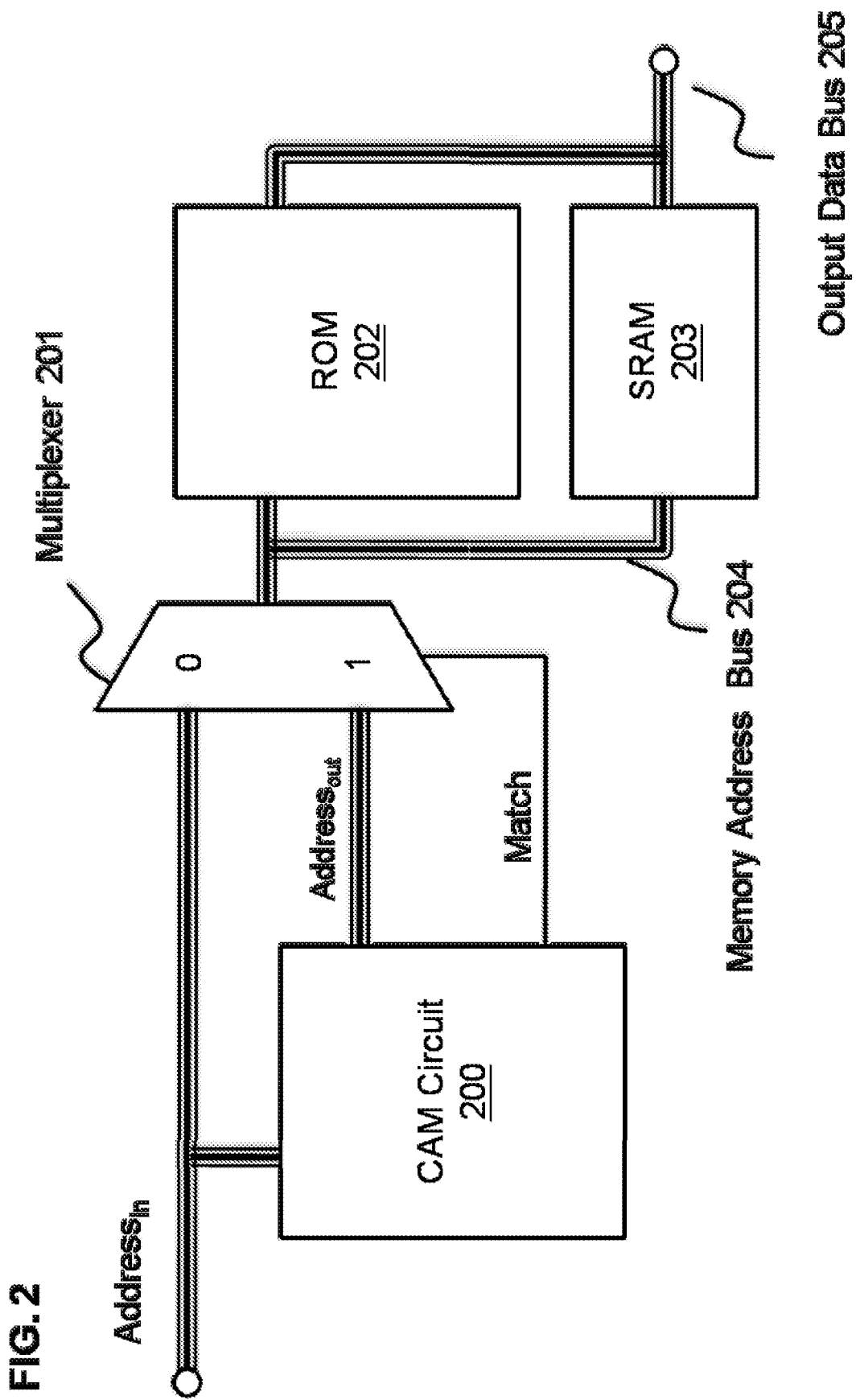
FIG. 2 illustrates a circuit for updating the data stored in ROM that is consistent with the present invention.

The present invention can be described by reference to FIG. 2 which displays is an embodiment of the present invention using static random access memory (SRAM) as the configurable memory for providing field upgrades to the ROM. SRAM is configurable and will hold its state indefinitely after programming as long as a required voltage is maintained across the SRAM circuit. SRAM block 203 is accessed by the same memory address bus 204 as ROM block 202. CAM circuit 200 is programmed with a set of direct addresses and a set of emulation addresses. The emulation addresses correspond to address lines in SRAM block 203 that are replacing outdated or faulty address lines in ROM block 202.

When there are no upgrades in the system; the direct addresses in CAM circuit 200 will not be programmed. Therefore, no matter what address is passed to CAM circuit 200 along input bus $Address_{in}$, the signal on line Match will stay low. Therefore, multiplexer 201 will continue to pass the address on $Address_{in}$ straight through to memory address bus 204 and ROM block 202 will be consulted without interference. Once a field upgrade is required, the CAM will be programmed with a direct address and, if required, a corresponding emulation address. When the circuit wants to access the old data in ROM block 202, the address on $Address_{in}$ will trigger a match signal in CAM circuit 200. At the same time, the emulated address will be sent out of CAM circuit 200 along bus $Address_{out}$. Since the match signal is high, multiplexer 201 will pass the data on bus $Address_{out}$ instead of the data on $Address_{in}$. The emulated address will be passed through multiplexer 201 and reference replacement data in SRAM block 203 as a replacement of the old code in ROM block 202. Succinctly, the circuit acts so that an address request sent along bus $Address_{in}$ will provide the code for a field upgrade stored in SRAM 203 along data output bus 205 if such an upgrade exists.

The circuit provides a benefit over other approaches in terms of limiting the complexity of emulation. Since the CAM alters the requested address, the operational code stored in ROM does not have to be modified to allow for field upgrades. When an upgrade is in place, the circuit simply does not consult the ROM. This is in contrast to a jump table approach where the operational code needs to contain periodic reference points for exiting the ROM code and consulting a configurable jump table. This circuit is also an improvement over the complex switch network approach of designing a switch network to reroute access to each ROM section to a section of RAM. In the currently described embodiment of the present invention, multiplexer 201 provides for a simple and size-conscious routing system that is made functional by the intelligence of CAM circuit 200. In large part, the original routing system for memory access is used while the arbiter merely alters the request placed on the routing.

The CAM address intervention circuit also has an advantage in terms of the speed of emulation. In a previously discussed embodiment of the invention the direct addresses are stored in volatile memory that can be read much faster than non-volatile memory (NVM). The values stored in the volatile memory can be reloaded at power-up from on-chip or off-chip slower non-volatile memory. Not only is the data faster to read directly but also the data in the storage registers does not have to be moved before being delivered to the circuit as in the indirect register approach so there is no additional write operation required. For the same reason, no additional read operation is required as in a jump table approach. The direct read action of the circuit is owed to the fact that the CAM arbiter is strictly hardware oriented once the direct addresses and emulation addresses have been matched. As a result of this pure hardware approach, the only added time for a read is the delay associated with the CAM comparator circuits in CAM 200 and multiplexer 201. This time is negligible compared to the time required for a read or write operation so the invention does not have any appreciable impact on the time required for memory access. In the embodiment where the CAM addresses are all volatile memory and the data is loaded from NVM, the speed improvement is accompanied by cost advantages. This is because such a design allows for the use of standard NVM arrays and the use of high-speed place and route or custom logic implementation of the CAM addresses and control logic.

The circuit also has an area benefit owing to the fact that defective addresses are replaced with a redundant memory of an equivalent size. The circuit only functions by replacing a single address location and corresponding data with a similarly sized data block. This provides an advantage over a jump table approach. Both the CAM and jump table have a certain amount of data that is wasted when the circuit is not upgraded. However, once programmed, a jump table will likely waste area since the data location jumped to may have more space than is required by the update. This is because the jump table memory blocks are a specific predetermined size and need to be large enough to contain any update. If all of the memory is not used for an upgrade the rest of the block is wasted. Contrarily, the address for address emulation of the CAM approach does not waste any space in this manner. This approach carries the related drawback that updates must match up in some way with the original code in terms of overall bytes upgraded. However, by replacing an adequately sized portion of the original code this requirement can be met by those persons skilled in the art.

A critical design choice necessary in implementing the current invention relates to the size of configurable memory necessary for a specific application. The size of the memory must be selected with regard to the likelihood of possible bugs in the hardware and the average anticipated size of patches to such bugs. The size must also include space for anticipated hardware updates. As mentioned previously, both of these components can be collectively referred to as field upgrades. The required size of the CAM and the configurable memory block involved can change dramatically depending upon the application. As an example, in one embodiment of the invention, the allowance for field upgrades is 32. Estimating that the average size of a corrective code segment is 128 bytes, this necessitates a configurable memory block of 4 kilobytes and a 32 entry CAM.

The disclosed invention can be applied to provide for a field upgrade of a device using a CAM address intervention circuit. Such a method is illustrated by the flowchart in FIG. 3. In step 300, the configurable memory is programmed with replacement data that will be replacing the original data in the non-configurable memory. Such data could be operating code or data referenced by other programs. Step 301 relates to programming the CAM. The address of the original data that will be replaced in the non-configurable memory is programmed into the CAM. The original data address is the direct address. In one embodiment of the invention the direct addresses are stored in SRAM or other fast volatile memory and are loaded with values by on-chip or off-chip slower NVM on power-up. In a location corresponding to the programmed direct address, the address of the replacement data in the configurable memory is programmed into the CAM. The replacement data address is the emulation address. The emulation address for the replacement data and the direct address for the original data form a stored address pair in the CAM. The emulation addresses may be preprogrammed. Programming can occur while the entire system is placed in a specific programming state or while the portion of the memory to be upgraded is not currently being accessed by the system. In step 302, the emulation circuit has been programmed and the rest of the system is allowed to operate as usual. The system will request the data at an original direct address not knowing if such data has been upgraded or not. The CAM arbiter will compare the requested address to the direct addresses in the stored address pairs in step 303. If the request address matches the direct address of a stored address pair, the circuit will move to step 305. If the request address does not match a stored direct address, then the circuit will move to step 304. In step 304, the circuit provides the original data at the requested location back to the system on an output data bus. If a match was found and step 305 was triggered, the CAM will send out an emulation address and a match signal so that the emulation address is passed to the memory circuit. The result will be that the data at the emulation address is sent to the output data bus. The outside circuit will not be able to detect the fact that the new data was accessed, which provides for a high degree of interoperability.

There are several variations on the discussed embodiments that provide utility in variant situations. The CAM can be configured to have any number of entries and could possibly have different address widths compared to the address bus. In such a situation, the CAM would replace any request for a specific block of ROM memory with a single address in the configurable memory. In addition, the configurable memory that forms the CAM and replacement memory block can be any type of RAM such as SRAM, DRAM, and MRAM or any type of volatile memory. The configurable memory could also be NVM. The ROM does not have to be non-configurable mask ROM either. The ROM could possibly be some type of PROM such as ultraviolet erasable PROM. The invention would still be useful in such situations because the CAM can be configured more easily than such a PROM can be reprogrammed. Finally, the CAM functionality could be integrated and dispersed through a decoding circuit where the ROM and configurable memory are set to use a common address decoding circuit.

Although embodiments of the invention have been discussed primarily with respect to specific embodiments thereof, other variations are possible. Various arbiter and memory access circuits may be used in place of, or in addition to, the circuit configurations presented herein. Functions may be performed by hardware or software, as desired. In general, any circuit diagrams presented are only intended to indicate one possible configuration, and many variations are possible. Those skilled in the art will also appreciate that methods and systems consistent with the present invention are suitable for use in a wide range of applications encompassing any that require emulated memory. While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims. Furthermore, those skilled in the art will appreciate that the foregoing description is by way of example only, and is not intended to limit the invention.

What is claimed is:

1. A content addressable memory arbiter emulation circuit for providing field upgrade capability to an electronic system:
    a content addressable memory circuit having an address in terminal coupled to a request address line routing a direct address, an address out terminal, a match signal line, a set of configurable direct addresses, and a set of emulation addresses; and
    a multiplexer having a pass control terminal coupled to said match signal line, a first pass input terminal coupled to said address out terminal, a second pass input terminal coupled to said request address line, and a pass output terminal outputting an access address;
    a memory address line coupled to said pass output terminal having a first access connection to a block of memory and a second access connection to a block of configurable memory;
    wherein said content addressable memory circuit outputs a match signal on said match signal line and outputs a particular emulation address of said set of emulation addresses corresponding to said direct address on said address out terminal when said direct address is in said set of configurable direct addresses;
    wherein said multiplexer outputs said particular emulation address on said pass output terminal as said access address when receiving said match signal on said pass control terminal and outputs said direct address on said pass output terminal as said access address when not receiving said match signal on said pass control terminal; and
    wherein said memory address line selects one of replacement data from said block of configurable memory in response to said particular emulation address and original data from said block of memory in response to said direct address depending upon the value of said access address to be passed to an output data line.

2. The content addressable memory arbiter emulation circuit of claim 1, wherein said block of configurable memory block is SRAM.

3. The content addressable memory arbiter emulation circuit of claim 1, wherein said block of memory is one of ultraviolet programmable ROM and mask ROM.

4. The content addressable memory arbiter emulation circuit of claim 1,
    wherein said block of configurable memory and said block of memory use a common address decoding scheme; and
    wherein said outputting of said access address is done through a decoding circuit.

5. The content addressable memory arbiter emulation circuit of claim 1, wherein said set of emulation addresses are non-configurable.

6. The content addressable memory arbiter emulation circuit of claim 1, wherein said direct address has one of an equivalent width as said particular emulation address and a larger width than said particular emulation address.

7. The content addressable memory arbiter emulation circuit of claim 1, wherein said replacement data from said block of configurable memory is the same size as said original data from said block of memory being replaced by said replacement data from said block of configurable memory.

8. The contents addressable memory arbiter emulation circuit of claim 1, wherein said set of configurable direct addresses are stored in one of SRAM and fast access registers.

9. The contents addressable memory arbiter emulation circuit of claim 8, wherein said set of configurable direct addresses is programmed on power-up by one of on-chip and off-chip NVM.

10. A method for providing field upgrades to an electronic system after manufacture and distribution, comprising the steps of:
    programming a block of configurable memory with replacement data to act as an upgrade of data in a memory block;
    encoding a content addressable memory with direct addresses and emulation addresses;
    receiving a direct address request on a request address line;
    comparing said direct address request to said direct addresses encoded in said content addressable memory;
    delivering a corresponding emulation address of one of said direct addresses to an address line as an access address if said direct address request is equivalent to said one of said direct addresses, whereby a replacement memory segment of said block of configurable memory is retrieved for said electronic system;
    sending said direct address request to said address line as said access address if said direct address request is not equivalent to any of said direct addresses, whereby an original memory segment of said memory block is retrieved for said electronic system.

11. The method of claim 10, wherein said programming and said encoding are accomplished in a concurrent manner.

12. The method of claim 10, wherein said programming and said encoding are accomplished in an on-line manner where said programming and said encoding update data that is not currently being accessed by the system.

13. The method of claim 10, wherein said block of configurable memory and said memory block use a common address decoding scheme; and wherein said comparing, delivering, and sending are conducted by a decoding circuit.

14. The method of claim 10, wherein said method can be repeated any number of times to provide further upgrades of said electronic system.

15. The method of claim 10, wherein said direct addresses have one of an equivalent width and a larger width than said emulation addresses.

16. The method of claim 10, wherein said replacement memory segment is the same size as said original memory segment being upgraded.

17. The method of claim 10, wherein said encoding said direct addresses is conducted at power-up.

18. The method of claim 17, wherein said encoding of said direct addresses includes transferring data from a NVM memory to said content addressable memory.

* * * * *